US011488978B2

United States Patent
Majhi et al.

(10) Patent No.: US 11,488,978 B2
(45) Date of Patent: Nov. 1, 2022

(54) FERROELECTRIC GATE OXIDE BASED TUNNEL FEFET MEMORY

(71) Applicant: Intel Corporation, Santa Clara, CA (US)

(72) Inventors: Prashant Majhi, San Jose, CA (US); Brian Doyle, Portland, OR (US); Ravi Pillarisetty, Portland, OR (US); Abhishek Sharma, Hillsboro, OR (US); Elijah Karpov, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 889 days.

(21) Appl. No.: 16/143,933

(22) Filed: Sep. 27, 2018

(65) Prior Publication Data

US 2020/0105788 A1   Apr. 2, 2020

(51) Int. Cl.
| | | |
|---|---|---|
| *H01L 29/78* | (2006.01) |
| *H01L 27/092* | (2006.01) |
| *H01L 27/11585* | (2017.01) |
| *H01L 29/51* | (2006.01) |
| *H01L 29/66* | (2006.01) |
| *H01L 29/08* | (2006.01) |

(52) U.S. Cl.
CPC .... *H01L 27/11585* (2013.01); *H01L 27/0924* (2013.01); *H01L 29/0847* (2013.01); *H01L 29/516* (2013.01); *H01L 29/6684* (2013.01); *H01L 29/78391* (2014.09); *H01L 29/7851* (2013.01)

(58) Field of Classification Search
CPC ........... H01L 27/11585; H01L 27/0924; H01L 29/0847; H01L 29/516; H01L 29/6684; H01L 29/78391; H01L 29/7851; H01L 29/0657; H01L 29/423; H01L 29/66356; H01L 29/7391; H01L 29/785
See application file for complete search history.

(56) References Cited

U.S. PATENT DOCUMENTS

| | | | | |
|---|---|---|---|---|
| 2006/0286755 A1* | 12/2006 | Brask | ................... | H01L 29/0847 257/E29.267 |
| 2019/0148499 A1* | 5/2019 | Lin | ........................ | H01L 29/861 257/288 |
| 2019/0221677 A1* | 7/2019 | Marino | ............. | H01L 29/66189 |

* cited by examiner

*Primary Examiner* — David Vu
(74) *Attorney, Agent, or Firm* — Schwabe, Williamson & Wyatt, P.C.

(57) ABSTRACT

A transistor is disclosed. The transistor includes a p-type region, an intrinsic region coupled to the p-type region, an n-type region coupled to the intrinsic region, and a gate electrode above the intrinsic region. The ferroelectric material is on a bottom, a first side and a second side of the gate electrode, and above the intrinsic region.

17 Claims, 7 Drawing Sheets

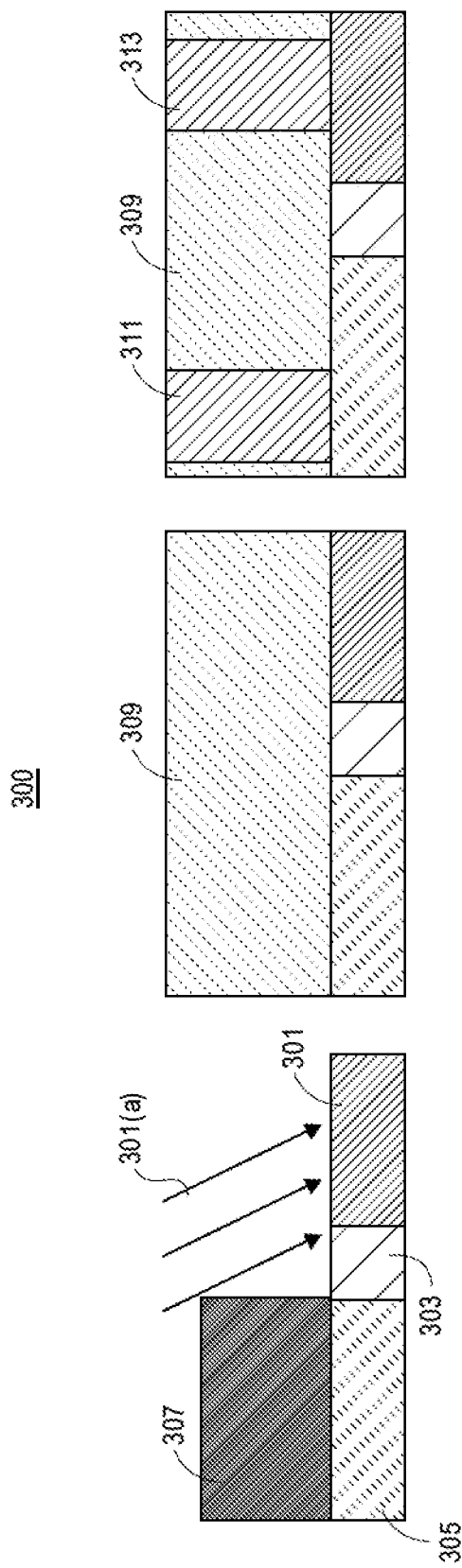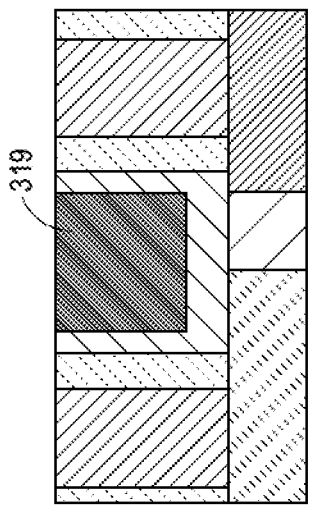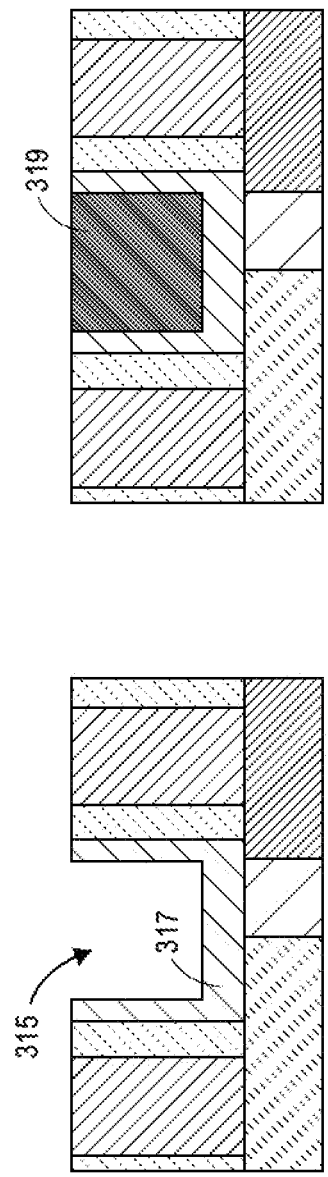

US 11,488,978 B2

FERROELECTRIC GATE OXIDE BASED TUNNEL FEFET MEMORY

TECHNICAL FIELD

Embodiments of the disclosure pertain to ferroelectric gate oxide based memory and, in particular, to ferroelectric gate oxide based tunnel ferroelectric transistor (FeFET) memory.

BACKGROUND

Ferroelectric transistors (FeFET) are being heavily researched as a potential embedded non-volatile memory (eNVM) technology that is scalable with regard to size as well as voltage. However, there still remains some significant challenges to the use of FeFETs such as: (1) poor memory window, and (2) low Ron/Roff ratio. These challenges can prevent their implementation in eNVM technology especially for use in large sized arrays where intrinsic variability can limit operating windows.

Current and previous approaches to improving memory windows and Ron/Roff ratio for ferroelectric transistors have focused on engineering the gate stack (including interfacial layers) for low voltage operation and optimizing process conditions to minimize variability (coercive field, polarization charge, sub-loop switching). However, these solutions do not fully mitigate the challenges posed by limited memory window and low Ron/Roff ratio.

BRIEF DESCRIPTION OF THE DRAWINGS

FIGS. 3A-3E illustrate a process flow for fabricating FeFET transistors according to an embodiment.

DESCRIPTION OF THE EMBODIMENTS

Figure 1B:
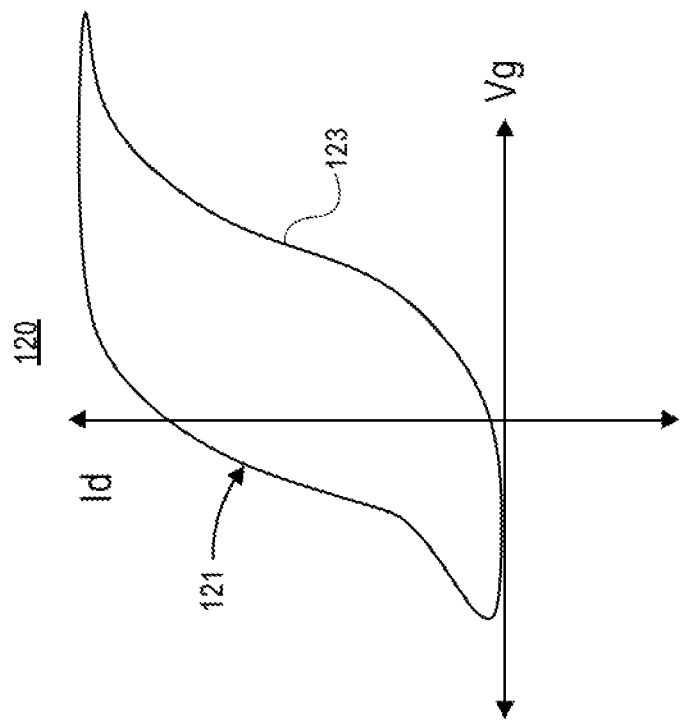
FIG. 1B shows an drain current-gate voltage (Id-Vg) graph corresponding to the transistor of FIG. 1A.

A ferroelectric gate oxide based tunnel FeFET memory is described. It should be appreciated that although embodiments are described herein with reference to example gate oxide based tunnel FeFET memory implementations, the disclosure is more generally applicable to other type FeFET memory implementations. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Current and previous approaches to improving memory windows and Ron/Roff ratio for ferroelectric transistors have focused on engineering the gate stack (including interfacial layers) for low voltage operation and optimizing process conditions to minimize variability (coercive field, polarization charge, sub-loop switching). However, these solutions do not fully address the challenges presented by limited memory windows and low Ron/Roff ratio.

An approach for widening the memory window and the Ron/Roff ratio that addresses the shortcomings of previous approaches is disclosed herein. As a part of the disclosed approach, a tunnel FET configuration is used. The tunnel FET configuration uses ferroelectric gate oxide to provide larger memory windows and Ron/Roff ratio. The dopant profile in the channel of the transistor enables a modulation of the intrinsic portion of the channel based on properties of the ferroelectric gate oxide (based on the polarization charge). The modulation of the intrinsic portion of the channel controls conductivity between the source and the drain of the transistor (tunneling for low Ron and no-tunneling for high Ron). The transistor conduction is characterized by high switching speed and high Ion to Ioff ratio. These characteristics produce steep subthreshold Id-Vg slopes, corresponding to larger memory windows and higher Ron/Roff ratios.

Figure 1A:
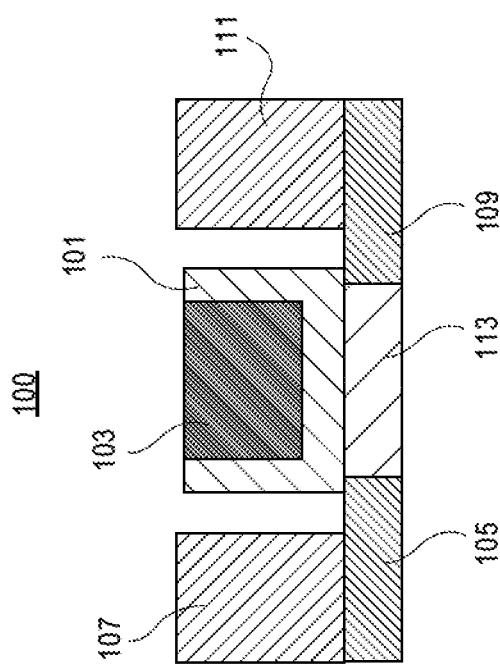
FIG. 1A is an illustration of a ferroelectric transistor used in non-volatile memory (NVM) technology according to a previous approach.

FIG. 1A is an illustration of a ferroelectric transistor 100 used in NVM technology according to a previous approach. The ferroelectric transistor 100 is characterized by a memory window and Ron/Roff ratio that is inadequate for applications that require size and voltage scalability. FIG. 1A shows a ferroelectric oxide 101, gate conductor 103, source region 105, source contact 107, drain region 109, drain contact 111 and intrinsic region 113.

Referring to FIG. 1A, the ferroelectric oxide 101 covers the bottom and side surfaces of the gate conductor 103. The gate conductor 103 and the bottom surface of the ferroelectric oxide 101 is formed above the intrinsic layer 113. The bottom surface of the ferroelectric oxide 101 also extends laterally to contact a part of the top surfaces of the source region 105 and the drain region 109. The source region 105 and the drain region 109 are formed on first and second sides of the intrinsic region 113. The source contact 107 is formed above the source region 105. The drain contact 111 is formed above the drain region 109.

The ferroelectric oxide 101, the gate conductor 103, the source contact 107 and the drain contact 111 are formed from conventional materials. The source region 105 and the drain region 109 are doped with conventional materials. The intrinsic region 113 is undoped.

In operation, during a read operation, a voltage is applied to the gate conductor 103 and the resulting voltage is read from the drain contact 111 to determine a stored data value. The voltage that is applied to the gate conductor 103 is used to modulate the ferroelectric material 101. This voltage causes the ferroelectric material 101 to become polarized to a desired polarization state. The polarization state of the ferroelectric oxide 101 biases the channel and determines the threshold voltage of the transistor. It should be appreciated that the ferroelectric oxide 101 has an inherent polarization and remains polarized even when the bias voltage that is applied to the gate conductor 103 is removed. FIG. 1B shows the Id-Vg characteristics 120 of the transistor 100. As shown in FIG. 1B the top trace 121 and the bottom trace 123 are characterized by non-steep Id-Vg subthreshold slopes that indicate a narrow memory window and small Ron/Roff ratio. Thus, the Id-Vg characteristics 120 of the transistor 100 of FIG. 1B shows that the transistor 101 of the previous approach is characterized by an inadequate memory window and Ron/Roff ratio.

Figure 2A:
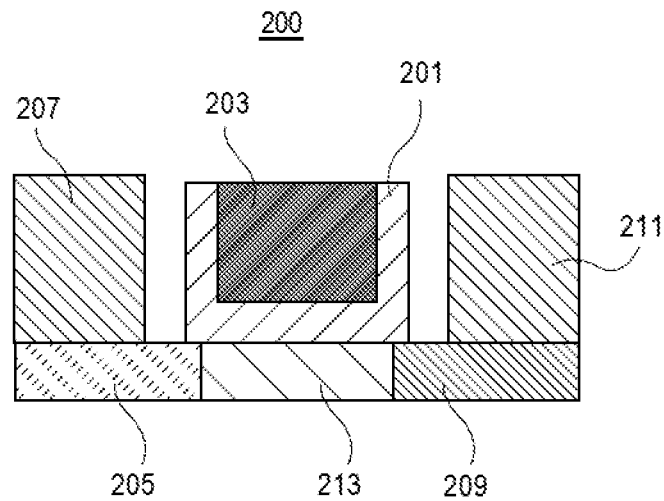
FIG. 2A is an illustration of a ferroelectric transistor for use in NVM technology according to an embodiment.

FIG. 2A is an illustration of a ferroelectric transistor 200 for use in NVM technology according to an embodiment. The ferroelectric transistor 200 is characterized by a wide memory window and high Ron/Roff ratio and can be used in applications that require size and voltage scalability. FIG. 2A shows a ferroelectric oxide 201, gate conductor 203, source region 205, source contact 207, drain region 209, drain contact 211 and intrinsic region 213.

Referring to FIG. 2A, the ferroelectric oxide 201 covers the bottom and side surfaces of the gate conductor 203. The gate conductor 203 and the bottom surface of the ferroelectric oxide 201 are formed above the intrinsic layer 213. The bottom surface of the ferroelectric oxide 201 also extends laterally to contact a part of the top surfaces of the source region 205 and the drain region 209. The source region 205 and the drain region 209 are formed on first and second sides of the intrinsic region 213. The source contact 207 is formed above the source region 205. The drain contact 211 is formed above the drain region 209.

In an embodiment, the ferroelectric oxide 201 can be formed from HfOx, Hf—Zr—O (doped with elements such as Al, Si, Gd, La) and other perovskites such as PZT. In other embodiments, the ferroelectric oxide 201 can be formed from other materials. In an embodiment, if the ferroelectric oxide 201 includes HfOx, the ferroelectric oxide 201 can be doped with materials such as Al, Si, Gd and La. In other embodiments, if the ferroelectric oxide 201 includes HfOx, the ferroelectric oxide 201 can be doped with other materials. In an embodiment, the gate conductor 203 can be formed from titanium or nickel. In other embodiments, the gate conductor 203 can be formed from other materials. In an embodiment, the source contact 207 can be formed from nickel. In other embodiments, the source contact 207 can be formed from other material. In an embodiment, the drain contact 211 can be formed from nickel. In other embodiments, the drain contact 211 can be formed from other material. In an embodiment, the source region 205 can be doped with a p-type impurities. In other, embodiments, the source region 205 can be doped with other type impurities. In an embodiment, the drain region 209 can be doped with n-type impurities. In other embodiments, the drain region 209 can be doped with other type impurities. In an embodiment, the intrinsic region 213 can be formed from undoped silicon. In other embodiments, the intrinsic region 213 can be formed from other materials. In an embodiment, the channel can be formed from Si, Ge, Si—Ge or group III-V elements. In other embodiments, the channel can be formed from other material. It should be appreciated that in an embodiment ferroelectric tunnel FeFETs such as the ferroelectric transistor 200 described with reference to FIG. 2A can be implemented as a FinFET device.

In operation, a memory cell can be accessed to read, store or erase data. The reading of data from a memory cell can be complicated by variability which can narrow the memory cell memory window. In an embodiment, to read information from a memory cell a voltage is applied to the gate of the associated transistor and a voltage is read from the drain of the associated transistor. In an embodiment, because of the wide memory window and high Ron/Roff ratio that is enabled by the transistor design described herein, challenges imposed by intrinsic variability are obviated. In an embodiment, overcoming the challenges imposed by intrinsic variability enables a continued scaling of memory arrays that are fabricated from ferroelectric transistors.

Figure 2B:
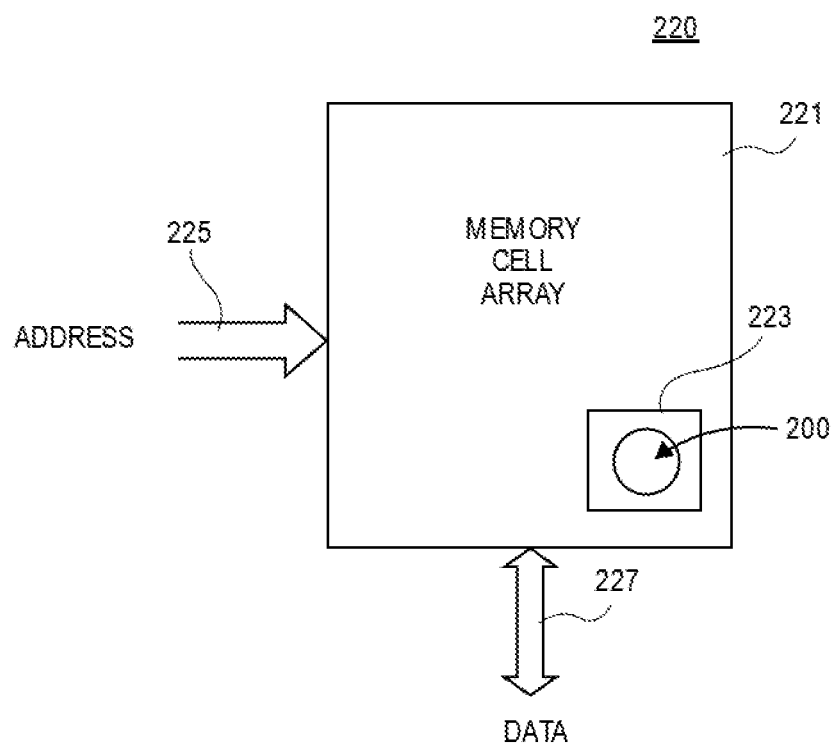
FIG. 2B shows a memory device that includes ferroelectric transistors according to an embodiment.

In an embodiment, the ferroelectric transistor 200 can be implemented as a FinFET in the backend of a semiconductor structure (e.g., wafer). In addition, referring to FIG. 2B, in an embodiment, the ferroelectric transistor 200 can be a part of a memory cell 223 in memory system 220 that can include array 221, address input 225 and data input/output 227 circuitry as is shown.

Figure 2C:
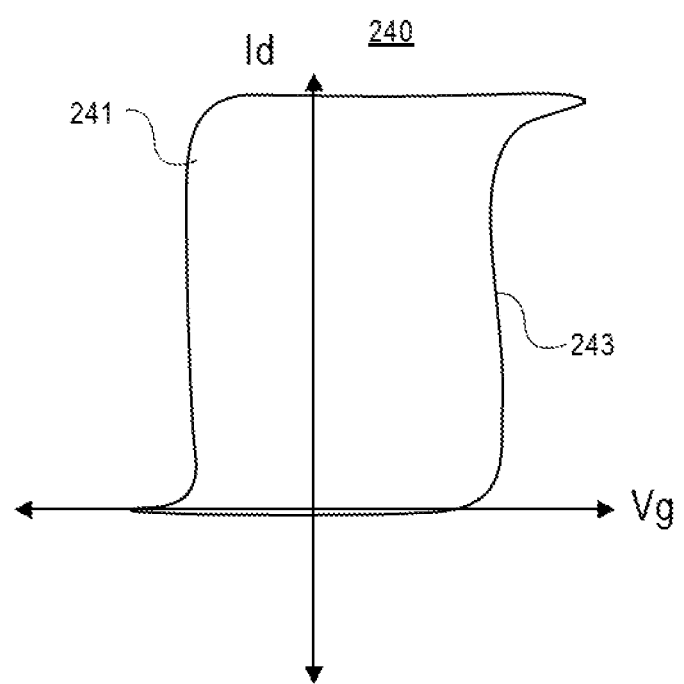
FIG. 2C shows an Id-Vg graph corresponding to the transistor of FIG. 2A.

FIG. 2C shows the Id-Vg transfer characteristics 240 of the ferroelectric transistor 200. As shown in FIG. 2C the top trace 241 and the bottom trace 243 include very steep Id-Vg subthreshold slopes that indicate a much wider memory window and higher Ron/Roff ratio than is provided by conventional ferroelectric transistors as described with reference to FIG. 1A. In an embodiment, the ferroelectric oxide of the ferroelectric transistor can exhibit a polarization charge of greater than 10 uC/cm2. In other embodiments, the ferroelectric oxide of the ferroelectric transistor exhibits other levels of polarization charge.

FIGS. 3A-3E illustrate a sample process flow that can be used to in the fabrication of ferroelectric transistors according to an embodiment. FIG. 3A shows a semiconductor structure 300 that includes drain region 301, intrinsic region 303, source region 305 and mask 307.

Referring to FIG. 3A, after one or more operations that result in the semiconductor structure 300 shown in FIG. 3A, impurities 301(a) are implanted into the drain region 301.

Referring to FIG. 3B, after one or more operations that result in the semiconductor structure 300 shown in FIG. 3A, the mask 307 is removed and the surface of the semiconductor structure 300 is covered with an insulator 309. In an embodiment, the insulator 309 can be formed from silicon dioxide. In other embodiments, the insulator 309 can be formed from other materials.

Referring to FIG. 3C, after one or more operations that result in the semiconductor structure 300 shown in FIG. 3B, spaces are formed in the insulator 309 and filled with conductive material 311 and 313. In an embodiment, the conductive material 311 and 313 is formed to contact the source and drain regions formed in the semiconductor structure 300. In an embodiment, the conductive material 311 and 313 can include titanium or nickel. In other embodiments, the conductive material can include other types of material.

Referring to FIG. 3D, after one or more operations that result in the semiconductor structure 300 shown in FIG. 3C, a trench 315 is formed in the part of the insulator material 309 that is located between the conductive materials 311 and 313. Thereafter, the trench 315 is lined with ferroelectric material 317. In an embodiment, the ferroelectric material 317 can be formed from HfOx. In other embodiments, the ferroelectric material 317 can be formed from other material.

Figure 4B:
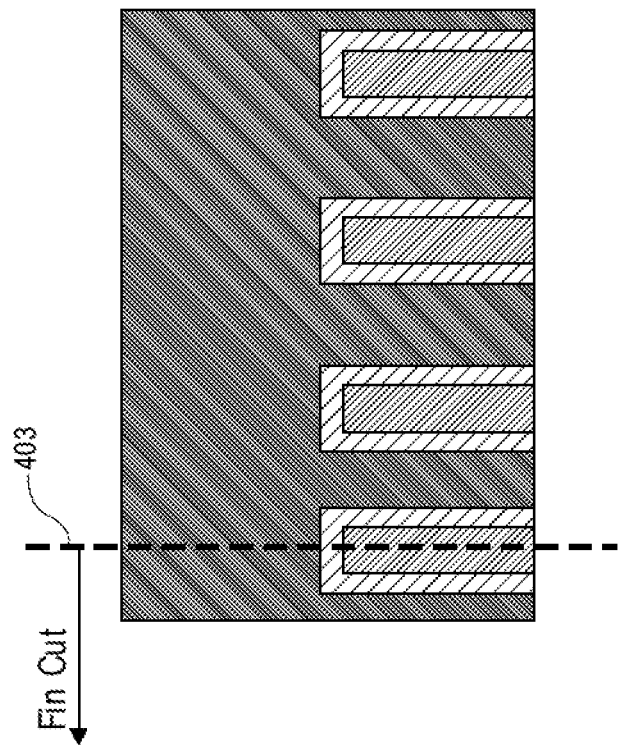
FIGS. 4A and 4B show perspective views of the final structure with a dashed line superimposed that indicates the position of a cut corresponding to a gate cut view and the position of a cut that corresponds to a fin cut view of the final structure respectively.
Figure 4A:
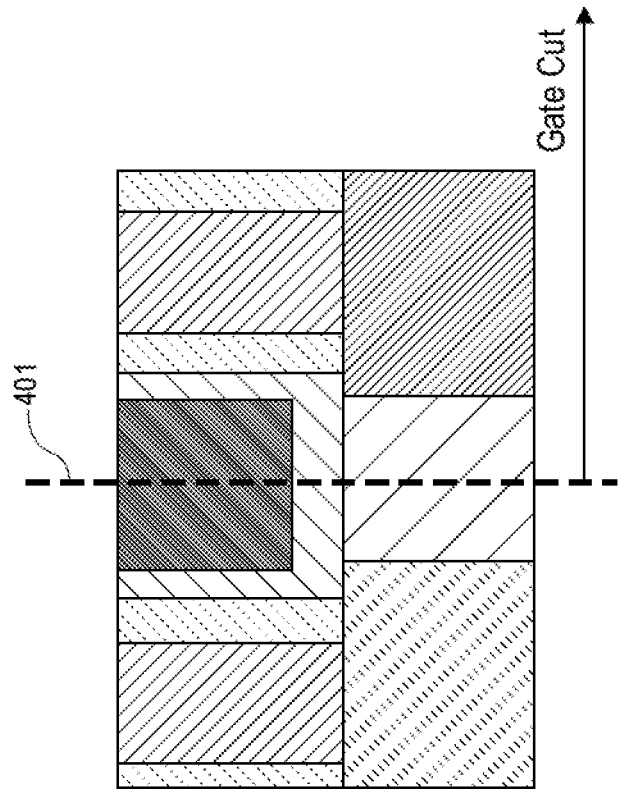

Referring to FIG. 3E, after one or more operations that result in the semiconductor structure 300 shown in FIG. 3D, the trench 315 that is lined with the ferroelectric material 317 is filled with conductive material 319. In an embodiment, the conductive material 319 can be formed from titanium or nickel. In other embodiments, the conductive material 319 can be formed from other material. FIGS. 4A and 4B show perspective views of the final structure with a dashed line superimposed that indicates the position of a cut corresponding to a gate cut view 401 and the position of a cut that corresponds to a fin cut view 403 of the final structure respectively. In the embodiments of FIGS. 4A and 4B, the final structure is a ferro-gated tunnel FeFET that has a FinFET form.

Implementations of embodiments of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the invention may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide (SiO2) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide (SiO2), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 5:
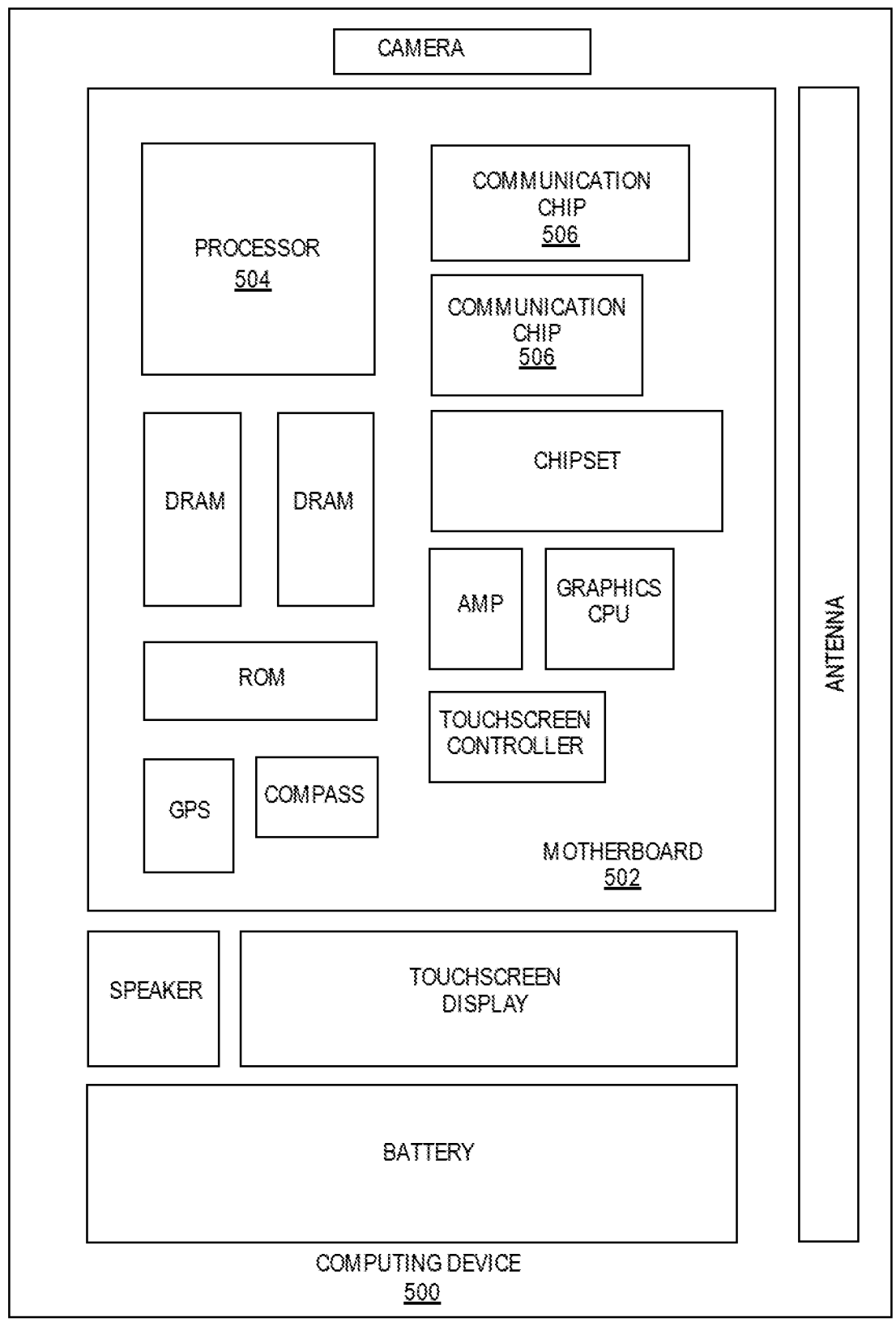
FIG. 5 illustrates a computing device in accordance with one implementation of the invention.

FIG. 5 illustrates a computing device 500 in accordance with one implementation of the invention. The computing device 500 houses a board 502. The board 502 may include a number of components, including but not limited to a processor 504 and at least one communication chip 506. The processor 504 is physically and electrically coupled to the board 502. In some implementations the at least one communication chip 506 is also physically and electrically coupled to the board 502. In further implementations, the communication chip 506 is part of the processor 504.

Depending on its applications, computing device 500 may include other components that may or may not be physically and electrically coupled to the board 502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 506 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 506 also includes an integrated circuit die packaged within the communication chip 506. In accordance with another implementation of the invention, the integrated circuit die of the communication chip includes one or more devices, such as MOS-FET transistors built in accordance with implementations of the invention.

In further implementations, another component housed within the computing device 500 may contain an integrated circuit die that includes one or more devices, such as MOS-FET transistors built in accordance with implementations of the invention.

In various implementations, the computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Figure 6:
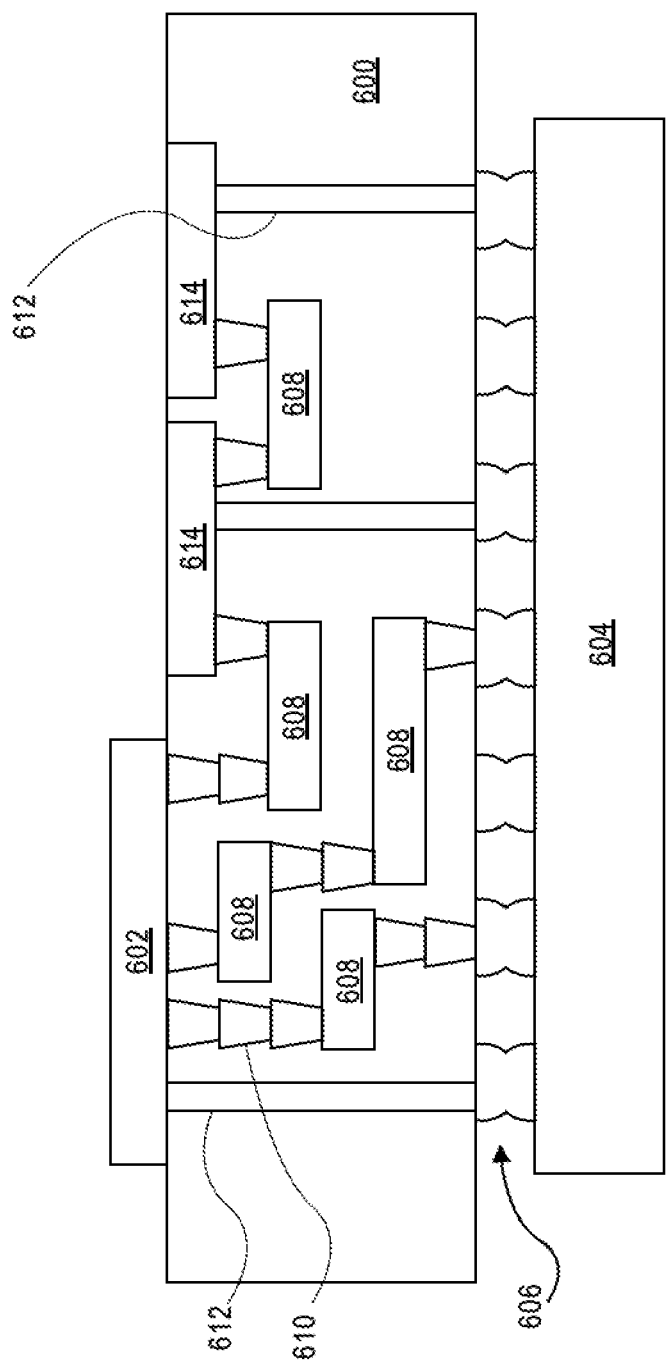
FIG. 6 illustrates an interposer that includes one or more embodiments of the invention.

FIG. 6 illustrates an interposer 600 that includes one or more embodiments of the invention. The interposer 600 is an intervening substrate used to bridge a first substrate 602 to a second substrate 604. The first substrate 602 may be, for instance, an integrated circuit die. The second substrate 604 may be, for instance, a memory module, a computer motherboard, or another integrated circuit die. Generally, the purpose of an interposer 600 is to spread a connection to a wider pitch or to reroute a connection to a different connection. For example, an interposer 600 may couple an integrated circuit die to a ball grid array (BGA) 606 that can subsequently be coupled to the second substrate 604. In some embodiments, the first and second substrates 602/604 are attached to opposing sides of the interposer 600. In other embodiments, the first and second substrates 602/604 are attached to the same side of the interposer 600. And in further embodiments, three or more substrates are interconnected by way of the interposer 600.

The interposer 600 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 608 and vias 610, including but not limited to through-silicon vias (TSVs) 612. The interposer 600 may further include embedded devices 614, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 600. In accordance with embodiments of the invention, apparatuses or processes disclosed herein may be used in the fabrication of interposer 600.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of the present disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of the present application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The following examples pertain to further embodiments. The various features of the different embodiments may be variously combined with some features included and others excluded to suit a variety of different applications.

Example embodiment 1: A transistor includes a p-type region, an intrinsic region coupled to the p-type region, an n-type region coupled to the intrinsic region, and a gate electrode above the intrinsic region. The ferroelectric material is on a bottom, a first side and a second side of the gate electrode, and above the intrinsic region.

Example embodiment 2: The transistor of example embodiment 1, wherein the intrinsic region is between the p-type region and the n-type region.

Example embodiment 3: The transistor of example embodiment 1, wherein conductive terminals are coupled to the p-type region and the n-type region.

Example embodiment 4: The transistor of example embodiment 1, wherein the ferroelectric material contacts the p-type region and the n-type region.

Example embodiment 5: The transistor of example embodiment 1, wherein the ferroelectric material is a ferroelectric oxide.

Example embodiment 6: The transistor of example embodiment 1, 2, 3, 4, and 5 wherein the gate electrode includes titanium.

Example embodiment 7: The transistor of example embodiment 3, wherein the conductive terminals include titanium.

Example embodiment 8: The transistor of example embodiment 1, wherein the transistor is a FinFET transistor.

Example embodiment 9: An NVM array including a data input and output circuit and a plurality of memory cells including a plurality of transistors. The plurality of transistors includes a p-type region, an intrinsic region coupled to the p-type region, an n-type region coupled to the intrinsic region and a gate electrode above the intrinsic region. A ferroelectric material on a bottom, a first side and a second side of the gate electrode, and above the intrinsic region.

Example embodiment 10: The array of example embodiment 9, wherein the intrinsic region is between the p-type region and the n-type region.

Example embodiment 11: The array of example embodiment 9, wherein conductive terminals are coupled to the p-type region and the n-type region.

Example embodiment 12: The array of example embodiment 9, wherein the ferroelectric material contacts the p-type region and the n-type region.

Example embodiment 13: The array of example embodiment 9, wherein the ferroelectric material is a ferroelectric oxide.

Example embodiment 14: The array of example embodiment 9, 10, 11, 12 and 13 wherein the gate electrode includes titanium.

Example embodiment 15: The array of example embodiment 11, wherein the conductive terminals include titanium.

Example embodiment 16: The array of example embodiment 9, wherein the plurality of transistors are FinFET transistors.

Example embodiment 17: A method includes forming a p-type region, forming an intrinsic region that is coupled to the p-type region, forming an n-type region that is coupled to the intrinsic region and forming a gate electrode above the intrinsic region. The method further includes forming a ferroelectric material on a bottom, a first side and a second side of the gate electrode, and above the intrinsic region.

Example embodiment 18: The method of example embodiment 17, wherein the intrinsic region is formed between the p-type region and the n-type region.

Example embodiment 19: The method of example embodiment 17, wherein conductive terminals are coupled to the p-type region and the n-type region.

Example embodiment 20: The method of example embodiment 17, wherein the ferroelectric material is formed to contact the p-type region and the n-type region.

What is claimed is:

1. A transistor, comprising:
   a p-type region;
   an intrinsic region coupled to the p-type region;
   an n-type region coupled to the intrinsic region;
   a gate electrode above the intrinsic region; and
   a ferroelectric material on a bottom, a first side and a second side of the gate electrode, and above the intrinsic region, wherein the ferroelectric material is in direct contact with the p-type region, the intrinsic region and the n-type region.

2. The transistor of claim 1, wherein the intrinsic region is between the p-type region and the n-type region.

3. The transistor of claim 1, wherein conductive terminals are coupled to the p-type region and the n-type region.

4. The transistor of claim 3, wherein the conductive terminals include titanium.

5. The transistor of claim 1, wherein the ferroelectric material is a ferroelectric oxide.

6. The transistor of claim 1, wherein the gate electrode includes titanium.

7. The transistor of claim 1, wherein the transistor is a FinFET transistor.

8. An NVM array, comprising:
   a data input and output circuit; and
   a plurality of memory cells including a plurality of transistors, comprising:
     a p-type region;
     an intrinsic region coupled to the p-type region;
     an n-type region coupled to the intrinsic region;
     a gate electrode above the intrinsic region; and
     a ferroelectric material on a bottom, a first side and a second side of the gate electrode, and above the intrinsic region, wherein the ferroelectric material is in direct contact with the p-type region, the intrinsic region and the n-type region.

9. The array of claim 8, wherein the intrinsic region is between the p-type region and the n-type region.

10. The array of claim 8, wherein conductive terminals are coupled to the p-type region and the n-type region.

11. The array of claim 10, wherein the conductive terminals include titanium.

12. The array of claim 8, wherein the ferroelectric material is a ferroelectric oxide.

13. The array of claim 8, wherein the gate electrode includes titanium.

14. The array of claim 8, wherein the plurality of transistors are FinFET transistors.

15. A method, comprising:
   forming a p-type region;
   forming an intrinsic region that is coupled to the p-type region;
   forming an n-type region that is coupled to the intrinsic region;
   forming a gate electrode above the intrinsic region; and
   forming a ferroelectric material on a bottom, a first side and a second side of the gate electrode, and above the intrinsic region, wherein the ferroelectric material is in direct contact with the p-type region, the intrinsic region and the n-type region.

16. The method of claim 15, wherein the intrinsic region is formed between the p-type region and the n-type region.

17. The method of claim 15, wherein conductive terminals are coupled to the p-type region and the n-type region.

\* \* \* \* \*